(12) United States Patent
Regev (10) Patent No.: US 6,707,694 B2
(45) Date of Patent: Mar. 16, 2004

(54) MULTI-MATCH DETECTION CIRCUIT FOR USE WITH CONTENT-ADDRESSABLE MEMORIES

(75) Inventor: Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/186,725

(22) Filed: Jul. 2, 2002

(65) Prior Publication Data

US 2003/0007378 A1 Jan. 9, 2003

Related U.S. Application Data (60) Provisional application No. 60/303,244, filed on Jul. 6, 2001.

(51) Int. Cl.[7] ............................................. G11C 15/00
(52) U.S. Cl. ............... 365/49; 365/230.01; 365/230.06; 365/230.09
(58) Field of Search ............................. 365/49, 230.01, 365/230.06, 230.09

(56) References Cited

U.S. PATENT DOCUMENTS

| | | | |
|---|---|---|---|
| 5,446,686 A | * | 8/1995 | Bosnyak et al. ............... 365/49 |
| 6,175,513 B1 | | 1/2001 | Khanna |
| 6,307,798 B1 | | 10/2001 | Ahmed et al. |
| 6,317,350 B1 | | 11/2001 | Pereira et al. |
| 6,370,613 B1 | | 4/2002 | Diede et al. |
| 6,392,910 B1 | * | 5/2002 | Podaima et al. ............... 365/49 |

OTHER PUBLICATIONS

Application Brief AB–N6, Music Semiconductors, What Is A Cam (Content–Addressable Memory)?, Sep. 30, 1998, pp. 1–4.

Application Brief AB–N11, Music Semiconductors, Advantages of CAM in Asic–Based Network Address Processing, Sep. 30, 1998, pp. 1–4.

* cited by examiner

*Primary Examiner*—Michael S. Lebentritt
*Assistant Examiner*—Toan Le
(74) *Attorney, Agent, or Firm*—Dickstein Shapiro Morin & Oshinsky LLP (57) ABSTRACT

A method and circuit for detecting multiple match conditions in a content addressable memory is disclosed. The circuit detects the multiple matches using a transistor array which is arranged as logical AND and OR gates. A current sensing detector provides multiple match detection when a current path is established through the transistor array when a multiple match exists.

23 Claims, 7 Drawing Sheets

MULTI-MATCH DETECTION CIRCUIT FOR USE WITH CONTENT-ADDRESSABLE MEMORIES

CROSS REFERENCE TO RELATED APPLICATIONS

This application claims priority to the provisional application No. 60/303,244, filed Jul. 6, 2001.

FIELD OF THE INVENTION

The invention relates to Content Addressable Memories (CAM) and circuits for detecting multiple matches therein.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data being stored within a given memory location) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., random access memory (RAM), dynamic RAM (DRAM), etc.). For example, data is stored in a RAM in a particular location, called an address. During a memory search on a RAM, the user supplies the address and gets back the data stored in that address (location).

In a CAM, however, data is stored in locations in a somewhat random fashion. The locations can be selected by an address, or the data can be written into a first empty memory location. Once information is stored in a memory location, it is found doing a memory search by comparing every bit in any memory location with every bit of data in a comparand register circuit. When the content stored in the CAM memory location does not match the data placed in the comparand register, the CAM device returns a no match indication. When the content stored in the CAM memory location matches the data placed in the comparand register, the CAM device returns a match indication. In addition, the CAM returns the identification of the address location in which the matching data is stored. Thus, with a CAM, the user supplies the data and gets back an indication of an address where a matching data is stored in the memory.

Locally, CAMs perform an exclusive-NOR (XNOR) function, so that a match is indicated only if both the stored bit and the corresponding input bit are the same state. CAMs are designed so that any number, or all of the memory locations may be simultaneously searched for a match with incoming data. In certain cases, data in more than a single location in the memory matches the input data, and such condition of multiple simultaneous matches must be detected and reported. However, circuitry for detecting multiple matches in a CAM memory generally is large and complex, and grows exponentially with the number of data words in the memory. Also, the switching time is impeded because of the parasitic capacitance associated with the complex logic. Thus, there is a need for a multiple match detector having increased switching speed, yet reduced circuit complexity.

BRIEF SUMMARY OF THE INVENTION

In one aspect, the invention provides a circuit for detecting multiple matches in a content addressable memory including a plurality of input pins where is are connected to a match line of the content addressable memory; a plurality of transistors connected to the input pins and logically arranged to detect a multiple match condition; a current source transistor for controlling the current through the plurality of transistors; and a current sensing detector connected to the plurality of transistors for outputting a signal indicating that a multiple match condition has been detected.

In an additional aspect, a portion of the plurality of transistors are connected in parallel to achieve a logical 'OR' condition; and a portion of the plurality of transistors are connected in series to achieve a logical 'AND' condition. In yet another aspect, a plurality of OR gates are connected to the input line of a multiple match signal. Additional aspects of the present invention include a method for operating the above components.

BRIEF DESCRIPTION OF THE DRAWING

The foregoing and other features and advantages of the invention will become more apparent from the detailed description of the exemplary embodiments of the invention given below in connection with the accompanying drawings in which.

DETAILED DESCRIPTION OF THE INVENTION

Content Addressable Memories (CAM) are associative memories wherein data at the input to the CAM is associated with data stored within the CAM, and upon command, the location of the associated data is provided as an output. Every data word within the CAM is equipped with logic devices that enable a comparison between it and the data at the CAM's input. A circuit determines the location of that word within the CAM, which matches the data at the CAM's input.

Figure 7:
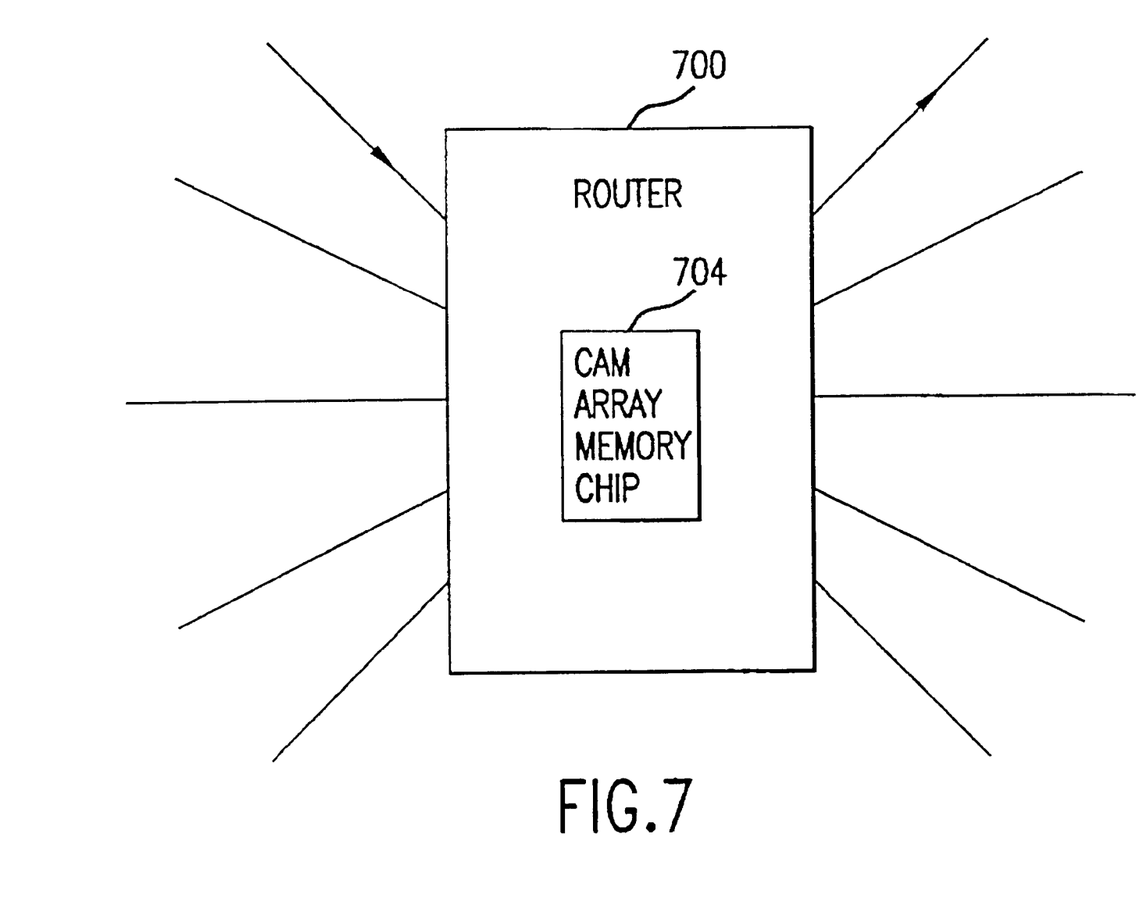
FIG. 7 depicts a simplified block diagram of a router employing a CAM array equipped with a multi-match circuit of the present invention.

FIG. 7 is a simplified block diagram of a router 700 connected to a CAM array memory chip 704 as may be used in a communications network, such as, e.g., part of the Internet backbone. The router 700 contains a plurality of input lines and a plurality of output lines. When data is transmitted from one location to another, it is sent in a form known as a packet. Oftentimes, prior to the packet reaching its final destination, that packet is first received by a router, or some other device. The router 700 then decodes that part of the data identifying the ultimate destination and decides which output line and what forwarding instructions are required for the packet.

Generally, CAMs are very useful in router applications because of their ability for instantaneous search of a large database. As a result, when a packet is received by the router 700, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Often more than one word in the CAM matches the associative data. It is desirable to detect all such multiple matches conditions. Accordingly, the present invention provides a method and apparatus for detecting a plurality of simultaneous memory word matches.

Every dataword in a CAM has associated therewith a digital comparator which compares the data stored in that word with the data present at the input to the CAM, also known as a comparand. When the two words match, a match flag is raised. Detecting a plurality of matches in a CAM requires an AND function between any combination of two match flags, to determine if both are active simultaneously.

The process of detecting multiple matches in the range of n inputs (I) is expressed in the following Boolean equation:

$$MM = I_0 \times I_1 + I_0 \times I_2 + \ldots I_0 \times I_n + I_1 \times I_2 + \ldots I_1 \times I_n + \ldots I_{n-1} \times I_n. \quad (1)$$

If this equation (1) is used in the process of detecting multiple matches, the number of logical gates required is the sum of the series:

$$n + (n-1) + (n-2) + \ldots (n-(n-1)) \quad (2)$$

where the outputs of all of these AND gates are then ORed together. However, implementing such an arrangement would require an unduly burdensome number of logic gates.

The equation (1) can be reduced to $$MM = I_0(I_1 + I_2 + \ldots I_n) + I_1(I_2 + I_3 + \ldots I_n) + I_{n-2}(I_{n-1} + I_n) + I_{n-1} \times I_n \quad (3)$$

In the equation (3) above, implementing an eight-input multiple match detector MM would mean setting 'n' equal to 8, which would result in the following:

$$MM = I_0(I_1 + I_2 + I_3 + \ldots I_7) + I_1(I_2 + I_3 \ldots I_7) + \ldots + I_6 \times I_7 \quad (4)$$

Using standard discrete logic elements to emulate the above operations is very cumbersome, and somewhat of a "brute force" approach. However, by arranging transistors to resemble digital logic elements, and then evaluating the logical state of those transistors using current sensing logic, the number of components can be substantially reduced and a more elegant solution for emulating the operations in equation (4) can be reached. Current sensing is employed in the invention for match detection. This is because with a voltage sensing circuit it is necessary to wait for the effects of parasitic capacitance, inherently present on signal lines, to dissipate. Such a wait is not necessary when current sensing techniques are used, therefore a current sensing circuit can be cycled more frequently that a voltage sensing circuit.

Figure 1:
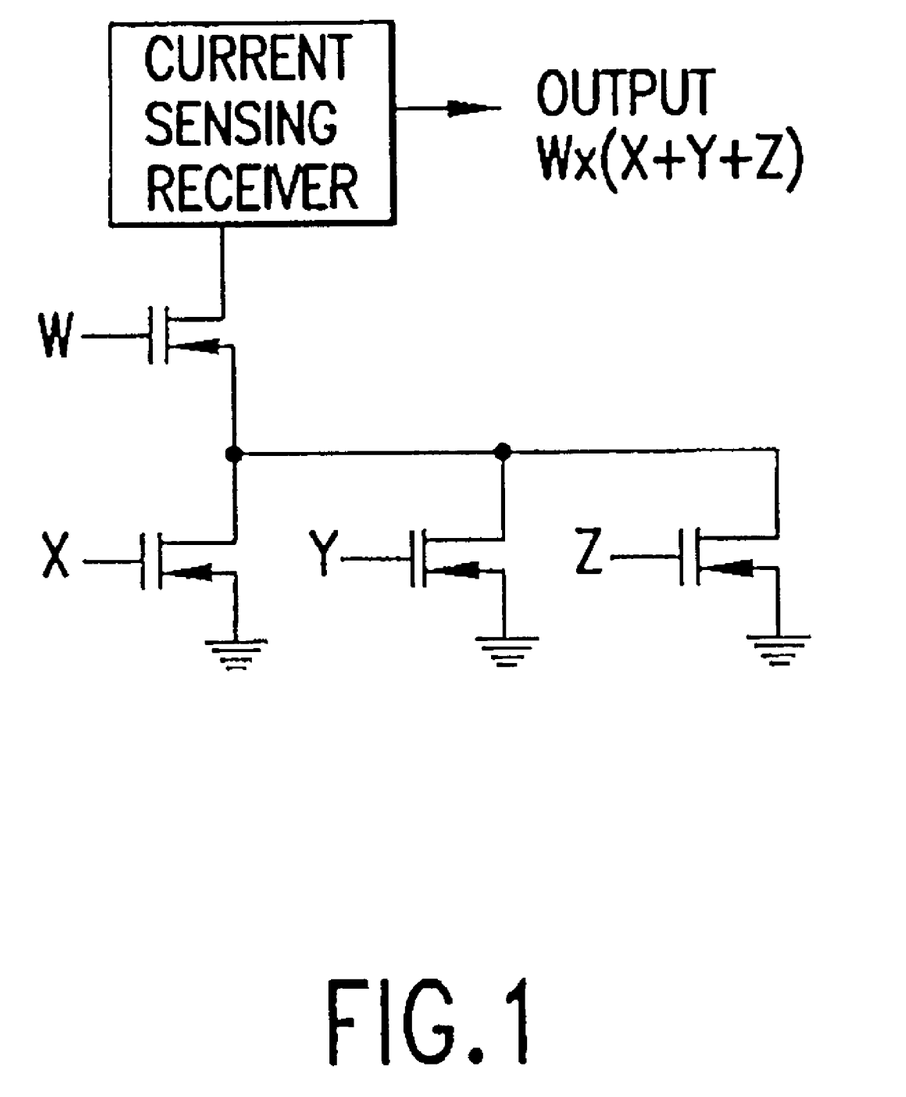
FIG. 1 is a schematic diagram depicting the use of transistors to achieve an AND and OR logic function.

FIG. 1 is an example of a current sensing logic gate useful in explaining the basics of the invention. An OR logic function is achieved by parallel connection of current conduction paths (switches), while AND logic functions is achieve by series connection of switches. As shown in FIG. 1, connecting the transistors X, Y, and Z in parallel achieves an OR function, while an AND function is achieved by connecting the results of the above OR function in series with the transistor W. Accordingly, when the transistor W is "on" and one or more of the transistors X, Y, Z is "on" a current path is established through the "on" transistor, which is then sensed by the current sensing receiver 11.

Figure 2:
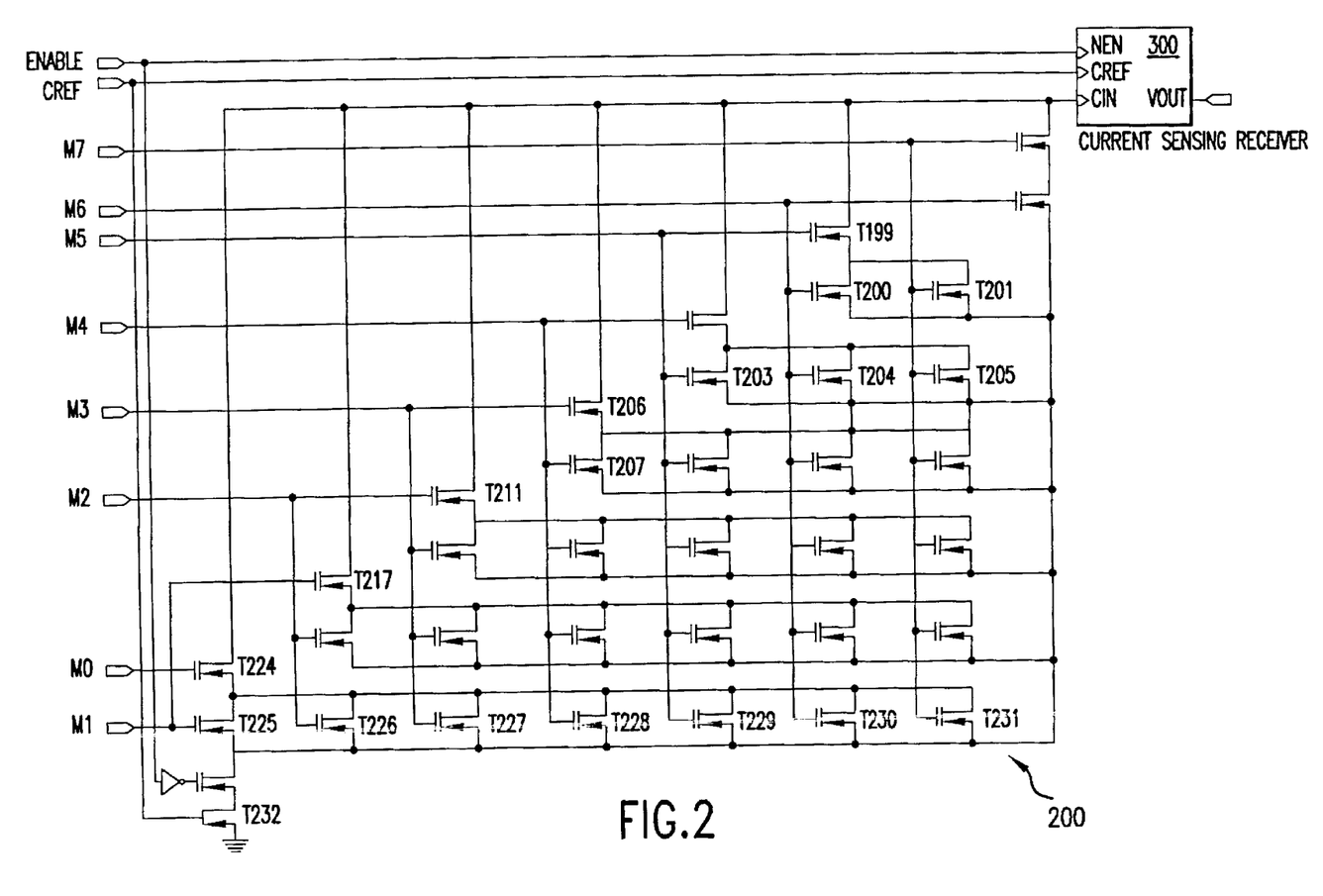
FIG. 2 is a schematic diagram of a CAM 8-bit multi-match circuit and current sense receiver in accordance with the present invention.

For example, FIG. 2 shows how transistors can be arranged to achieve three separate logical levels. In the first level, certain combinations of match inputs are 'OR'ed together. On the second level the outputs from the first level are 'AND'ed together with the inputs that were not already 'OR'ed. In the third level (hereinafter referred to as 'F' level) the outputs of the second level are 'OR'ed together.

A current sense match detection circuit 200 using the current sensing logic of FIG. 1 is shown is shown in FIG. 2, where the transistor T232 acts as a current source, controlling the current flow throughout the entire logic circuit 200. The input pins $M_{0-7}$ each separately indicate that a match has been indicated in a CAM array (not shown). In the circuit 200, the transistors T225–231 execute the following OR function Π:

$$\Pi = (M_1 + M_2 + M_3 + M_4 + M_5 + M_6 + M_7) \quad (5)$$

In FIG. 2 the T224 source is connected to all of the combined draines of the transistors T225–231. Thus, the transistor T224 is in series with all of the transistors T225–231 and forms an AND function between Π and the input pin $M_0$ to yield another function $F_0$:

$$F_0 = M_0 \times (M_1 + M_2 + M_3 + M_3 + M_4 + M_5 + M_6 + M_7) \quad (6)$$

Similarly, the remaining logic gate transistors in the circuit 200 also generate the following functions:

$$F_1 = M_1 \times (M_2 + M_3 + M_4 + M_5 + M_6 + M_7) \quad (7)$$

$$F_2 = M_2 \times (M_3 + M_4 + M_5 + M_6 + M_7) \quad (8)$$

$$F_3 = M_3 \times (M_4 + M_5 + M_6 + M_7) \quad (9)$$

$$F_4 = M_4 \times (M_5 + M_6 + M_7) \quad (10)$$

$$F_5 = M_5 \times (M_6 + M_7) \quad (11)$$

$$F_5 = M_6 \times M_7 \quad (12)$$

With the drains of T197, T198, T202, T206, T211, T217, and T224 all connected in parallel and therefore in 'OR' form (current summation), the complete logical gating function of the circuit of FIG. 2 is:

$$MM = F_0 + F_1 + F_2 + F_3 + F_4 + F_5 + F_6 + F_7. \quad (13)$$

In the case of an 8-bit comparand, the equation (3) above can be reduced to $$MM = M_0(M_1 + M_2 + \ldots M_7) + M_1(M_2 + M_3 + \ldots M_7) + M_6 \times M_7 \quad (14)$$

Thus, a logical circuit for determining when more than one of the match lines $M_{0-7}$ are simultaneously high is achieved.

Figure 3:
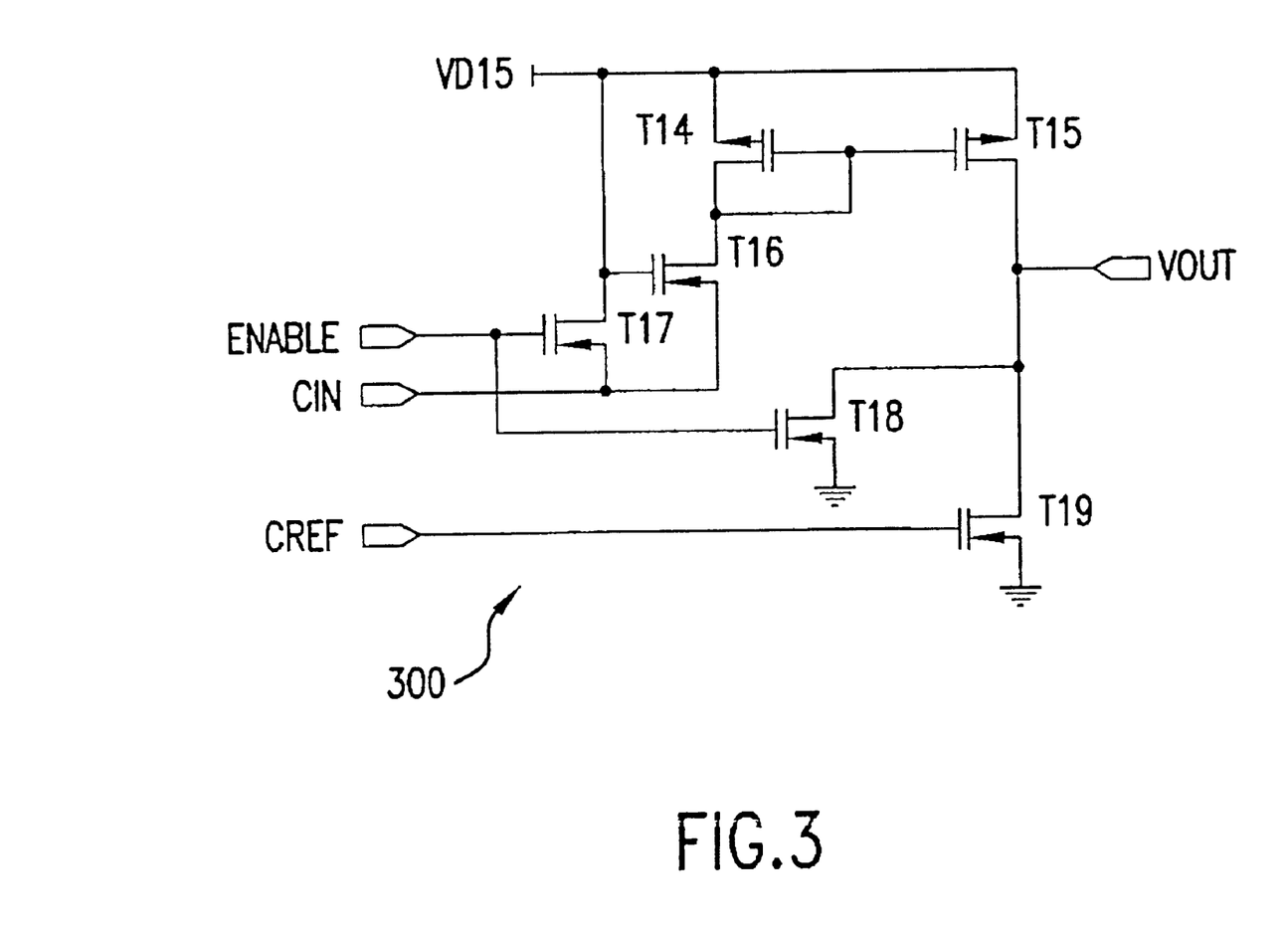
FIG. 3 is a schematic diagram of a current sense receiver in accordance with the present invention.

The current sensing receiver 300 used in the present invention to determine when the logic circuits formed by the transistors of FIG. 2 indicate a multiple match on input lines $M_{0-7}$ is shown in FIG. 3. The current sensing receiver 300 operates in quasi-synchronous mode. Specifically, when the (active low) ENABLE line is asserted low, both transistors T17 and T18 are turned off. As a result, current drawn at the input pin CIN flows through transistors T14 and T16, causing a mirroring current generated by transistor T15 to charge the output capacitance of transistor T19 as well as the parasitic capacitance on the output pin VOUT. As a result the voltage at VOUT has the potential to be asserted high, depending on the state of the input current pin CIN as described below.

Conversely, when the ENABLE pin is asserted high, transistor T17 pulls the input current pin CIN to a voltage of $V_{CIN}=V_{DD}-V_{TH(T17)}$, where $V_{TH(T17)}$ is the threshold voltage of the transistor T17. The transistor T17 is designed to be much larger than the transistor T16, so that while the ENABLE line is high, most of the current on pin CIN flows through transistor T17. Also, when the ENABLE line is asserted high, the transistor T18 is turned ON, which shorts the output pin VOUT to ground.

When there are no multiple matches on the inputs to the circuit 200, none of the AND gates formed within the circuit 200 are asserted. Therefore, there is no current path to ground from the pin CIN so that no current flows through CIN, so that VOUT remains low, regardless of whether the ENABLE line is asserted low or not.

The active low ENABLE signal is such that the presence or absence of a ground path through the circuit 200 at CIN cannot affect the state of VOUT unless the ENABLE line is asserted low. Thus, the receiver circuit 300 operates quasi-synchronously with the ENABLE signal clocking the receiver 300.

Figure 4:
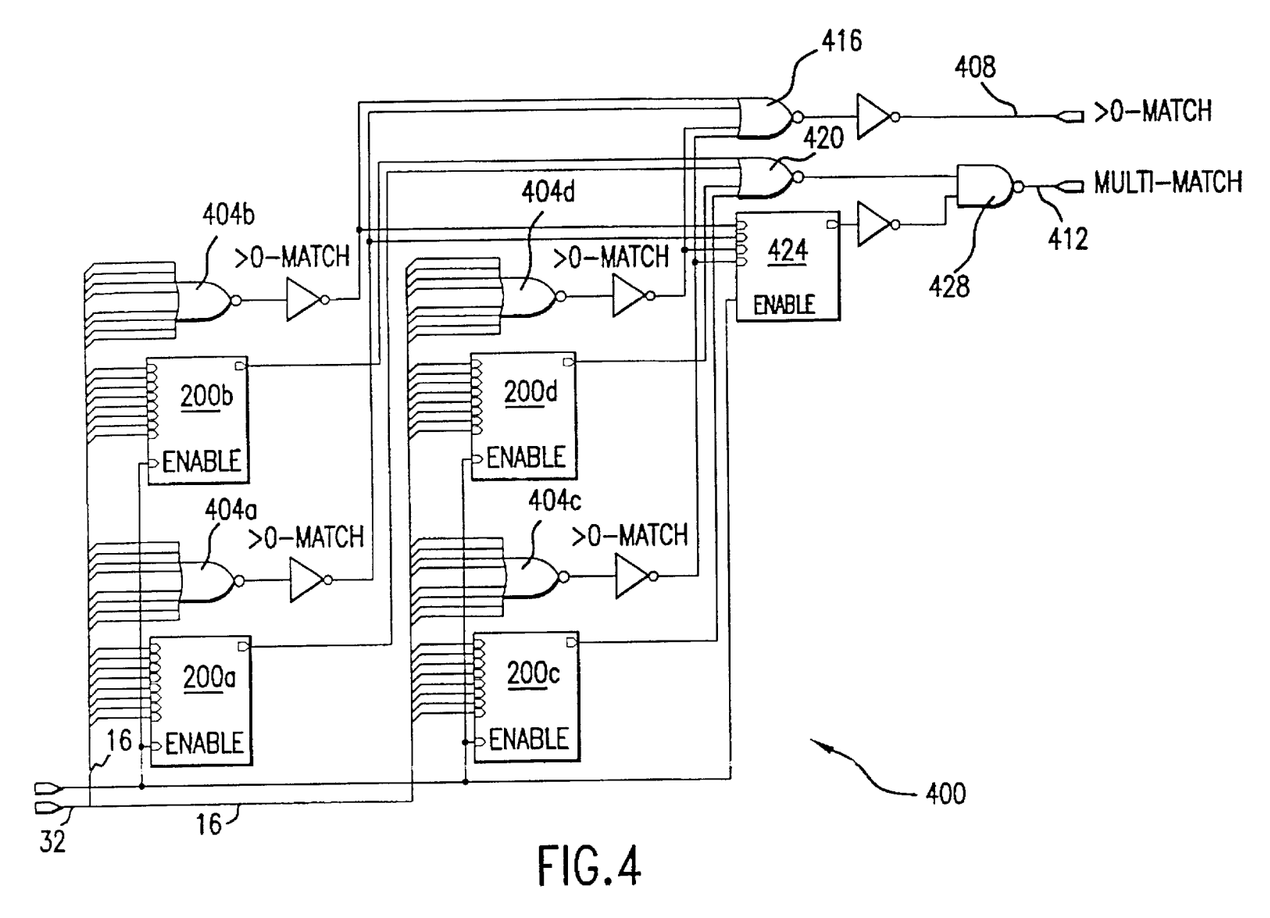
FIG. 4 is a schematic diagram grouping four of the 8-bit circuits of FIG. 2 in accordance with the present invention.

FIG. 4 shows four 8-bit multi-match circuits 200a, 200b, 200c, and 200d. The four multi-match circuits 200a–d are grouped together to achieve a 32-bit multi-match circuit 400. The inputs to the respective multi-match circuits 200a–d are also applied to the respective NOR gates 404a–d. The outputs of the four multi-match circuits 200a–d are applied to the NOR gate 420, and then AND-ed with the output of the multi-match circuit 424 as will be described.

In the event a multi-match occurs within the same octet of match lines, the output of one of the detectors 200a–d will be enabled, which will then put a binary '0' at the output of NOR gate 420.

In the event that a multiple match condition occurs not within the same 200a, 200b, 200c, or 200d octet, but between octets, wherein one match is detected in one octet, and another match is detected in a different octet, the output of two or more of the NOR gates 404a–d will be asserted and then applied at the input of the 4-way multi-match circuit 424, simultaneously with being applied at the NOR gate 416.

The NOR gates 404a–d also detect that at least one (>0) of the match lines input to its associated multi-match circuit has indicated a match. The outputs of these NOR gates are connected both to the NOR gate 416, and the four inputs multi match detector unit 424. If the output of at least one NOR gate 404 is asserted, the output of the NOR gate 416 is asserted as well, causing the ">0 Match" line 408 to be asserted, indicating at least a single match in the space of all 32 inputs. The NOR gate 420 verifies that at least one of the multi match circuits 200a–d has been asserted, indicating a multi match in at least one octet of inputs. The 4-input multi-match detector 424, is connected to the NOR gates 404a, b, c, and d, which are asserted when at least one match is detected in an octet of inputs. Whenever the outputs of two or more of the NOR gates 404 are asserted, the 4-input multi-match detector 424, detects a multi match condition created by least tow single matches, in two or more octets. The NAND gate 428 acts to sum the outputs of NAND gate 420 and the 4-input multi-match detector 424.

Figure 5:
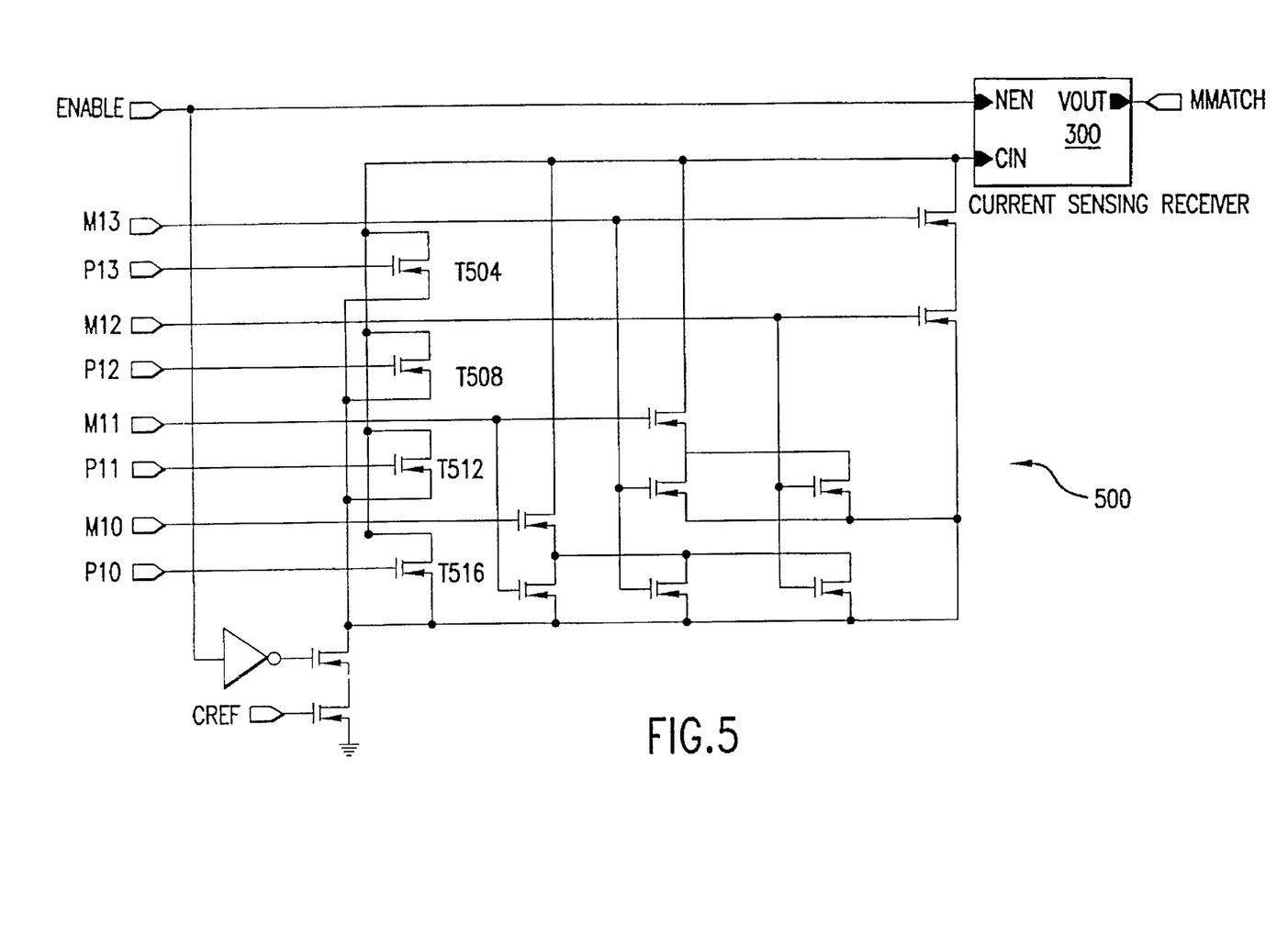
FIG. 5 is a schematic diagram of a 4-bit multi-match circuit incorporating OR logic directly therein in accordance with the present invention.

The multi match output 412 is the result of an OR function between the outputs of the four multi match detectors 200, and the 4-input multi-match detector 424. FIG. 5 shows a how a four inputs OR gate to sum the results of the 8-input multi-match detector 200, is comprised of the transistors T504, T508, T512, and T516, connected in parallel. In addition FIG. 5, shows a 4-input multi-match detector, comprised of the remaining 7 transistors. This part of the 4-input multi-match detector is similar to the circuit of the 8-input multi-match detector shown in FIG. 2, except of having only 4 inputs instead of 8. As shown in FIG. 1, an OR function is achieved by connecting current paths in parallel. Therefore the OR function required to sum up the operation of the 4-input multi-match detector 424, is achieved by summing the currents that can flow either through the 4 input OR gate comprised of T504, T508, T512, and T516, as well as 4-input multi-match detector section comprised of the remainder of the transistors. The lines $Pl_{0-3}$ are be connected to the outputs of other multi-match detectors such as 200a–d in FIG. 4, while the lines $Ml_{0-3}$ originate from the outputs of non-octet detecting gates such as the gates 404a–d as shown in FIG. 4. Like the transistors X, Y, and Z of FIG. 1, the transistors 504, 508, 512, and 516 have their sources commonly connected, their drains commonly connected, and their gates connected to inputs $Pl_{0-3}$. Thus the transistors 504, 508, 512, and 516 are grouped in an 'OR' configuration, so that if any of the lines $Pl_{0-3}$ are asserted, current will flow to the CIN pin of the current sensing receiver 300. However, the $Ml_{0-3}$ lines are connected similarly to that described in connection with FIG. 2, so that raising one or more of the $Ml_{0-3}$ lines will result in current flowing to the CIN pin. Like the circuit of FIG. 2, if only a single Ml line is asserted, no current will flow to the CIN pin. Thus, the circuit 500 in FIG. 5 is a more elegant way of implementing the non-octet (in this case non-quartet) multi-match detection logic 400 of FIG. 4 within the same circuit as a 4-input multi-match detector, albeit using OR rather than NOR gates. The circuit 500 achieves substantial savings in logic gates over the circuit of 400 of FIG. 4.

Figure 6:
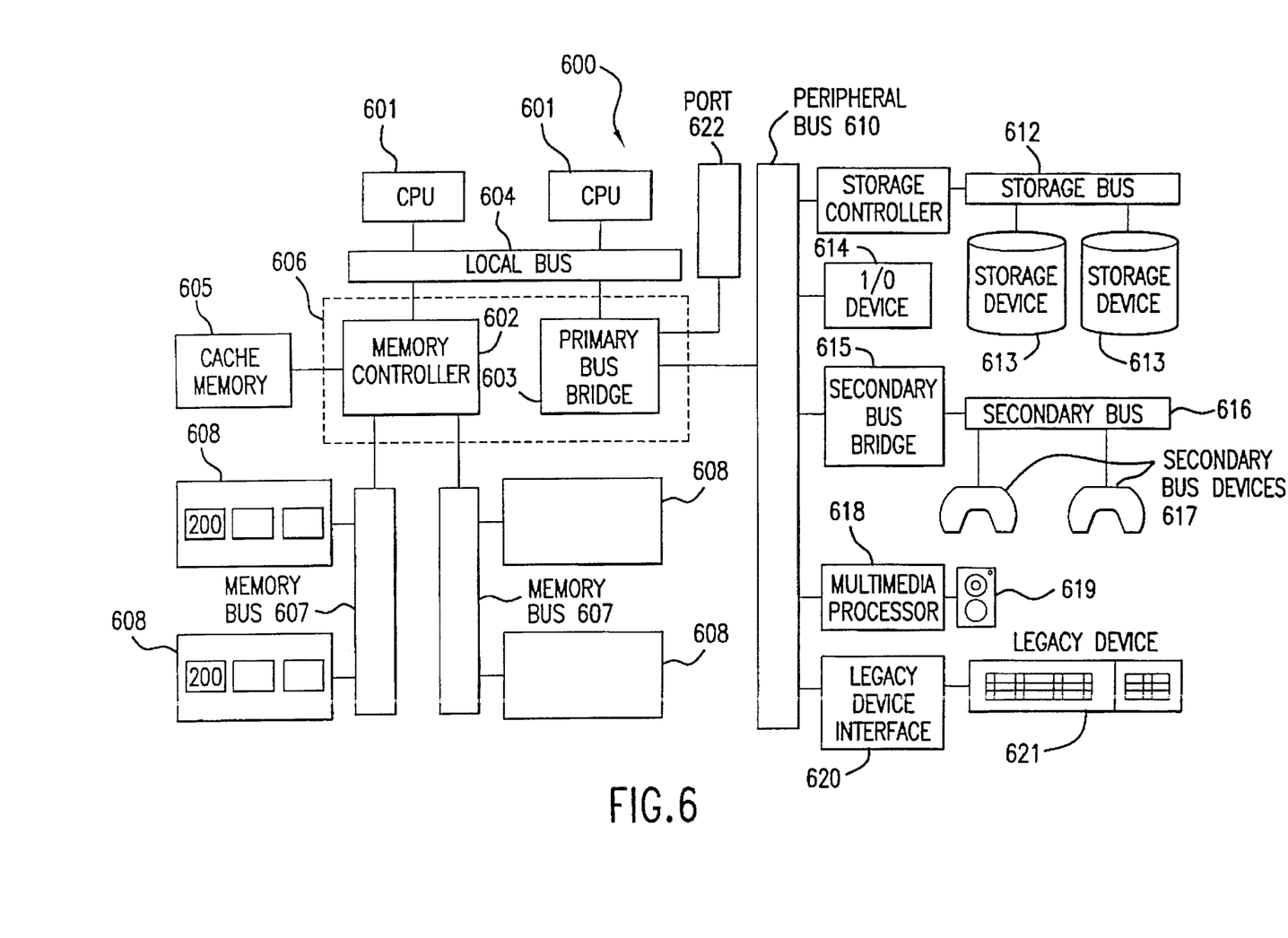
FIG. 6 shows use of CAM in accordance with the present invention used within a processor system.

FIG. 6 illustrates an exemplary processing system 600 which utilizes the match detection circuit of the present invention. The processing system 600 includes one or more processors 601 coupled to a local bus 604. A memory controller 602 and a primary bus bridge 603 are also coupled the local bus 604. The processing system 600 may include multiple memory controllers 602 and/or multiple primary bus bridges 603. The memory controller 602 and the primary bus bridge 603 may be integrated as a single device 606.

The memory controller 602 is also coupled to one or more memory buses 607. Each memory bus accepts memory components 608. Any one of memory components 608 may contain a CAM array containing a match detection circuit such as the match detection circuit 200 of the present invention.

The memory components 608 may be a memory card or a memory module. The memory components 608 may include one or more additional devices 609. For example, in a SIMM or DIMM, the additional device 609 might be a configuration memory, such as a serial presence detect (SPD) memory. The memory controller 602 may also be coupled to a cache memory 605. The cache memory 605 may be the only cache memory in the processing system. Alternatively, other devices, for example, processors 601 may also include cache memories, which may form a cache hierarchy with cache memory 605. If the processing system 600 include peripherals or controllers which are bus masters or which support direct memory access (DMA), the memory controller 602 may implement a cache coherency protocol. If the memory controller 602 is coupled to a plurality of memory buses 607, each memory bus 607 may be operated in parallel, or different address ranges may be mapped to different memory buses 607.

The primary bus bridge 603 is coupled to at least one peripheral bus 610. Various devices, such as peripherals or additional bus bridges may be coupled to the peripheral bus 610. These devices may include a storage controller 611, an miscellaneous I/O device 614, a secondary bus bridge 615, a multimedia processor 618, and an legacy device interface 620. The primary bus bridge 603 may also coupled to one or more special purpose high speed ports 622. In a personal computer, for example, the special purpose port might be the Accelerated Graphics Port (AGP), used to couple a high performance video card to the processing system 600.

The storage controller 611 couples one or more storage devices 613, via a storage bus 612, to the peripheral bus 610. For example, the storage controller 611 may be a SCSI controller and storage devices 613 may be SCSI discs. The I/O device 614 may be any sort of peripheral. For example, the I/O device 614 may be an local area network interface, such as an Ethernet card. The secondary bus bridge may be used to interface additional devices via another bus to the processing system. For example, the secondary bus bridge may be an universal serial port (USB) controller used to couple USB devices 617 via to the processing system 600. The multimedia processor 618 may be a sound card, a video capture card, or any other type of media interface, which may also be coupled to one additional devices such as speakers 619. The legacy device interface 620 is used to couple legacy devices, for example, older styled keyboards and mice, to the processing system 600.

The processing system 600 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 600 to become more suitable for use in a variety of applications. For example, many electronic devices which require processing may be implemented using a simpler architecture which relies on a CPU 601 coupled to memory components 608 and/or memory devices 609. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A multiple match detector for use in a content addressable memory, comprising:
   a plurality of input pins, each connected to a match detector of said content addressable memory;
   a plurality of transistors connected to said input pins, logically arranged to detect a multiple match condition; a multiple match condition being indicated by an electrical current path to a sensing pin through at least some of said plurality of transistors;
   a current source transistor for sourcing and/or limiting the current through said electrical path; and
   a current sense circuit connected to said sensing pin, for outputting a signal when a multiple match condition has been detected.

2. The detector of claim 1, wherein said logical arrangement of transistors further comprises:
   at least one logical gate circuit, each said at least one logical gate circuit comprising:
      at least one first group of said plurality of transistors connected in parallel to achieve a logical 'OR' circuit; and
      at least one of said plurality of transistors connected in series to match said first group of transistors form a logical 'AND' circuit.

3. The detector of claim 1, further comprising:
   a logic circuit connected to said input pins, for verifying the authenticity of a multiple match signal detected by said plurality of transistors.

4. The circuit of claim 1, wherein said current sense circuit is enabled by an applied control signal.

5. The circuit of claim 1, wherein said plurality of transistors are logically arranged in three separate levels such that within the first level, certain combinations of match inputs are 'OR'ed together;
   within a second level the outputs from the first level are 'AND'ed together with match inputs not already 'OR'ed; and
   within a third level the outputs of the second level are 'OR'ed together.

6. A multiple match detection circuit for use in a content-addressable memory, comprising:
   a plurality of first multiple match detectors for detecting a multiple match condition within a predetermined set of match lines;
   the inputs of all of said first multiple match detectors being simultaneously connected to a plurality of logic gates, the outputs of said logic gates being connected to an second multiple match detector so as to detect multiple match conditions spanning multiple sets of match lines.

7. The detection circuit of claim 6, wherein said first and second multiple match detectors further comprise:
   a plurality of input pins, each connected to a match line of said content addressable memory;
   a plurality of transistors connected to said input pins, logically arranged to detect a multiple match condition; a multiple match condition being indicated by an electrical current path to a sensing pin through at least some of said plurality of transistors;
   a current source transistor for sourcing and/or limiting the current through said electrical path; and
   a current sense circuit connected to said sensing pin, for outputting a signal when a multiple match condition has been detected.

8. The detector of claim 7, wherein said logical arrangement of transistors further comprises:
   at least one logical gate circuit, each said at least one logical gate circuit comprising:
      at least one first group of said plurality of transistors connected in parallel to achieve a logical 'OR' circuit; and
      at least one of said plurality of transistors connected in series to match said first group of transistors form a logical 'AND' circuit.

9. The detector of claim 7, further comprising:
   a logic circuit connected to said input pins, for verifying the authenticity of a multiple match signal detected by said plurality of transistors.

10. The circuit of claim 7, wherein said current sense circuit is enabled by an applied control signal.

11. The circuit of claim 7, wherein said plurality of transistors are logically arranged in three separate levels such that within the first level, certain combinations of match inputs are 'OR'ed together;
- within a second level the outputs from the first level are 'AND'ed together with match inputs not already 'OR'ed; and
- within a third level the outputs of the second level are 'OR'ed together.

12. A method for detecting multiple matches in a content addressable memory, comprising:
- monitoring a plurality of match lines;
- arranging a plurality of transistors to achieve logical AND and logical OR functionality;
- sorting the signals present on said match lines using said logical functionality;
- detecting when a plurality of said signals are asserted; and
- outputting an signal that said plurality of match signals has occurred.

13. The method of claim 12, further comprising determining that a match condition has occurred between lines connected to separate match detectors.

14. A processor circuit, comprising
- a processor; and
- a content-addressable memory circuit for exchanging data with said processor;
- at least one of said processor and memory circuit comprising a multiple match detection circuit comprising:
  - a plurality of input pins, each connected to a match line of said content addressable memory;
  - a plurality of transistors connected to said input pins, logically arranged to detect a multiple match condition; a multiple match condition being indicated by an electrical current path to a sensing pin through at least some of said plurality of transistors;
  - a current source transistor for sourcing and/or limiting the current through said electrical path; and
  - a current sense circuit connected to said sensing pin, for outputting a signal when a multiple match condition has been detected.

15. The detector of claim 14, wherein said logical arrangement of transistors further comprises:
- at least one logical gate circuit, each said at least one logical gate circuit comprising:
  - at least one first group of said plurality of transistors connected in parallel to achieve a logical 'OR' circuit; and
  - at least one of said plurality of transistors connected in series to match said first group of transistors form a logical 'AND' circuit.

16. The detector of claim 14, further comprising:
- a logic circuit connected to said input pins, for verifying the authenticity of a multiple match signal detected by said plurality of transistors.

17. The circuit of claim 14, wherein said current sense circuit is enabled by an applied control signal.

18. The circuit of claim 14, wherein said plurality of transistors are logically arranged in three separate levels such that within the first level, certain combinations of match inputs are 'OR'ed together;
- within a second level the outputs from the first level are 'AND'ed together with match inputs not already 'OR'ed; and
- within a third level the outputs of the second level are 'OR'ed together.

19. A multiple match detector for use in a content addressable memory, comprising:
- a plurality of input pins, each connected to a match detector of said content addressable memory;
- a plurality of transistors connected to said input pins, logically arranged to detect a multiple match condition; a multiple match condition being indicated by an electrical current path to a sensing pin through at least some of said plurality of transistors;
- a current sense circuit connected to said sensing pin, for outputting a signal when a multiple match condition has been detected.

20. The detector of claim 19, wherein said logical arrangement of transistors further comprises:
- at least one logical gate circuit, each said at least one logical gate circuit comprising:
  - at least one first group of said plurality of transistors connected in parallel to achieve a logical 'OR' circuit; and
  - at least one of said plurality of transistors connected in series to match said first group of transistors form a logical 'AND' circuit.

21. The detector of claim 19, further comprising:
- a logic circuit connected to said input pins, for verifying the authenticity of a multiple match signal detected by said plurality of transistors.

22. The circuit of claim 19, wherein said current sense circuit is enabled by an applied control signal.

23. The circuit of claim 19, wherein said plurality of transistors are logically arranged in three separate levels such that within the first level, certain combinations of match inputs are 'OR'ed together;
- within a second level the outputs from the first level are 'AND'ed together with match inputs not already 'OR'ed; and
- within a third level the outputs of the second level are 'OR'ed together.

* * * * *

UNITED STATES PATENT AND TRADEMARK OFFICE
CERTIFICATE OF CORRECTION

PATENT NO.   : 6,707,694 B2
DATED        : March 16, 2004
INVENTOR(S)  : Zvi Regev It is certified that error appears in the above-identified patent and that said Letters Patent is hereby corrected as shown below:

Column 3,
Line 61, "that" should read -- than --.
Line 65, "is" should read -- are --.

Column 4,
Line 25, "draines" should read -- drains --.

Column 5,
Line 63, "tow" should read -- two --.

Column 6,
Line 42, "coupled" should read -- coupled to --.

Column 7,
Line 11, "may also" should read -- may also be --.
Line 19, "an" should read -- a --.
Line 23, "an" should read -- a --.

Column 9,
Line 21, "an" should read -- a --.

Signed and Sealed this

Twenty-second Day of March, 2005

JON W. DUDAS
*Director of the United States Patent and Trademark Office*